United States Patent
Shedletsky

(10) Patent No.: US 9,190,720 B2
(45) Date of Patent: Nov. 17, 2015

(54) FLEXIBLE PRINTED CIRCUIT STRUCTURES

(71) Applicant: Apple Inc., Cupertino, CA (US)

(72) Inventor: Anna-Katrina Shedletsky, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 283 days.

(21) Appl. No.: 13/629,218

(22) Filed: Sep. 27, 2012

(65) Prior Publication Data

US 2013/0249740 A1  Sep. 26, 2013

Related U.S. Application Data

(60) Provisional application No. 61/615,156, filed on Mar. 23, 2012.

(51) Int. Cl.
*H01Q 1/38* (2006.01)
*H05K 1/02* (2006.01)

(52) U.S. Cl.
CPC ............... *H01Q 1/38* (2013.01); *H05K 1/028* (2013.01); *H05K 2201/0191* (2013.01); *H05K 2201/10098* (2013.01); *Y10T 29/49016* (2015.01)

(58) Field of Classification Search
CPC .... H01Q 1/38; H05K 1/28; H05K 2201/0191
USPC ............... 343/700 MS, 702; 29/600
See application file for complete search history.

(56) References Cited

U.S. PATENT DOCUMENTS

| | | | |
|---|---|---|---|
| 5,638,597 A | 6/1997 | Cutting et al. | |
| 6,005,524 A * | 12/1999 | Hayes et al. | 343/702 |
| 6,603,432 B2 * | 8/2003 | Hill et al. | 343/702 |
| 8,127,432 B2 | 3/2012 | Viscarra et al. | |
| 8,308,722 B2 * | 11/2012 | Ormsby et al. | 606/41 |
| 2005/0264448 A1 * | 12/2005 | Cox et al. | 343/700 MS |
| 2008/0248258 A1 | 10/2008 | Hao | |

FOREIGN PATENT DOCUMENTS

| | | |
|---|---|---|
| KR | 2007082638 | 8/2007 |
| WO | 2005055685 | 6/2005 |

\* cited by examiner

*Primary Examiner* — Tho G Phan
(74) *Attorney, Agent, or Firm* — Treyz Law Group; Joseph F. Guihan

(57) ABSTRACT

Flexible printed circuit structures may be provided that have regions with different electrical and mechanical properties. A flexible printed circuit substrate may be formed from a sheet of polymer having different regions with different thicknesses. The flexible printed circuit substrate may be bent in a thin region of the substrate. Additional flexible printed circuit substrate portions may be coupled to the flexible printed circuit substrate. The additional portions may have different substrate thicknesses. A groove or other recess may be formed in a flexible printed circuit substrate to promote bending. Openings may also be formed in the substrate to promote bending.

14 Claims, 23 Drawing Sheets

FLEXIBLE PRINTED CIRCUIT STRUCTURES

This application claims the benefit of provisional patent application No. 61/615,156 filed Mar. 23, 2012, which is hereby incorporated by reference herein in its entirety.

BACKGROUND

This relates generally to printed circuit structures and, more particularly, to flexible printed circuit structures.

Electronic devices such as computers, cellular telephones, and other equipment contain electrical components. Electrical components may be mounted on printed circuits. Printed circuits may also be used to form structures such as antennas, transmission lines, and signal buses.

Some printed circuits are formed using flexible substrate materials. For example, flexible printed circuits may be formed using sheets of a flexible polymer such as polyimide. Layers of patterned metal traces may be formed on the flexible polyimide substrate material.

In some devices, flexible printed circuits are mounted in a planar configuration. In other devices, flexible printed circuits are bent. For example, a flexible printed circuit antenna or flexible printed circuit signal bus may be bent. It may be desirable to form a bend in a flexible printed circuit to allow the flexible printed circuit to be incorporated within the potentially tight confines of an electronic device housing or to better utilize available volume within the device housing.

It can be challenging to form bends in flexible printed circuits, particularly when the flexible printed circuits include relatively thick substrate material.

It would therefore be desirable to be able to provide improved flexible printed circuit structures.

SUMMARY

Flexible printed circuit structures may be provided that have regions with different electrical and mechanical properties. In one region of a flexible printed circuit structure, for example, the structure may be configured to provide satisfactory performance for a transmission line or other electrical structure. In another region, the flexible printed circuit may be configured to facilitate bending. A bent flexible printed circuit structure may be mounted on a support structure and installed in an electronic device housing.

A flexible printed circuit substrate may be formed from a sheet of polymer having different regions with different thicknesses. The flexible printed circuit substrate may be bent in a portion of the substrate that is relatively thin. Additional flexible printed circuit substrate portions may be coupled to the flexible printed circuit substrate using conductive material such as solder or conductive adhesive. An additional portion may have a different substrate thickness than the substrate portion to which it is connected.

A groove or other recess may be formed in a flexible printed circuit substrate to promote bending. Grooves and portions of a substrate with different thicknesses may be formed using a die, using a mold, using extruding equipment, using roller-based equipment, using machining equipment, using light-based processing equipment, using scribing equipment, by selectively depositing polymers, by selectively removing polymers, or by otherwise processing the substrate. Openings may also be formed in the substrate to promote bending.

Further features of the invention, its nature and various advantages will be more apparent from the accompanying drawings and the following detailed description of the preferred embodiments.

DETAILED DESCRIPTION

Figure 1:
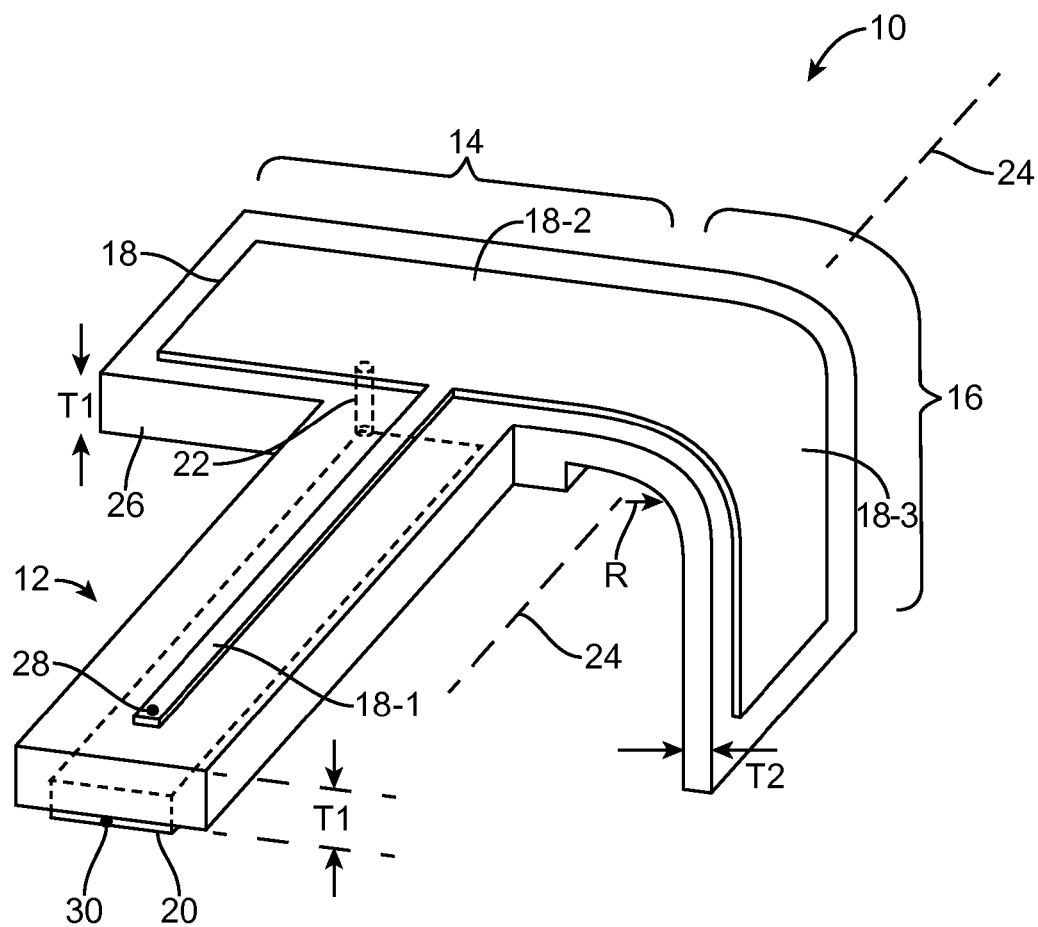
FIG. 1 is a perspective view of illustrative flexible printed circuit structures in accordance with an embodiment of the present invention.

Electronic devices such as computers, tablet computers, desktop computers, televisions, media players, cellular telephones, wireless access points, set-top boxes, and other electronic equipment may include printed circuits. Printed circuits may be formed from patterned conductive layers and dielectric layers. Patterned conductive layers may be formed from metal (e.g., metal traces). In rigid printed circuit boards, dielectric layers may be formed form fiberglass-filled epoxy (e.g., FR4) or other rigid dielectric materials. In flexible printed circuits ("flex circuits"), dielectric layers may be formed from flexible sheets of polyimide or other flexible polymer layers.

Printed circuit structures such as flexible printed circuit structures may be used as substrates for electrical components such as microprocessors, memory chips, application-specific integrated circuits, and other integrated circuits, discrete components such as capacitors, resistors, and inductors, connectors, switches, filters, and other circuitry. Printed circuit structures such as flexible printed circuit structures may also be used in forming flex circuit signal buses (e.g., parallel paths for analog and/or digital signals), antenna structures (e.g., ground plane structures, antenna resonating element structures, and parasitic antenna resonating element structures), radio-frequency transmission line structures, and other printed circuit structures.

In some situations, such as when forming transmission line structures, it may be desirable to ensure that a minimum thickness is used for the flexible printed circuit substrate. In a microstrip transmission line structure, for example, it may be desirable to separate a positive signal line on an upper surface of the flexible printed circuit from a ground signal line on the lower surface of the flexible printed circuit by a minimum separation of T1. The value of T1 may, for example, be 50 microns, a value in the range of 10-100 microns, a value less than 70 microns, a value more than 10 microns, or a value more than 40 microns.

The thickness of the flexible printed circuit substrate that is used in forming the transmission line structure and associated antenna structures may be thicker than desired for forming a bend in the flexible printed circuit to accommodate mounting constraints. As an example, satisfactory bends may be formed in a printed circuit when the thickness of the printed circuit substrate is a maximum of thickness T2. The value of T2 may be, for example, 25 microns, 50 microns, a value in the range of 10-100 microns, less than 100 microns, less than 40 microns, or other suitable value.

In an illustrative arrangement, satisfactory microstrip transmission line structures may be formed using a flexible printed circuit substrate thickness of 50 microns, whereas satisfactory flexible printed circuit bending may be achieved by using a flexible printed circuit substrate thickness of 25 microns (as an example).

To accommodate diverging thickness requirements such as these, flexible printed circuit structures may be formed that have different regions, each of which has different corresponding flexibility and/or thickness characteristics. As an example, one portion of a flexible printed circuit substrate may have a thickness of T1 that is satisfactory for forming microstrip transmission lines, whereas another portion of the flexible printed circuit substrate may have a thickness of T2 that is satisfactory for forming one or more bends. The bends that are formed may include a 90° bend (i.e., a right-angle bend), a bend characterized by an angle of less than 120°, a bend characterized by an angle of less than 180° and greater than 120°, a bend characterized by an angle of less than 100°, a bend characterized by an angle of 90° or less, a bend characterized by an angle of less than 50°, a bend about a 2-dimensional or 3-dimensional spline, or a bend with a different bend angle. Regions of different flexibility and suitability for forming structures such as transmission line structures may also be implemented by selectively thinning metal layer structures and/or other printed circuit layers, by forming holes along a bend axis, or by forming a groove to promote bending.

Illustrative flexible printed circuit structures of the type that may have at least a first region for supporting transmission line structures or other structures that operate satisfactorily with a relatively thick flexible printed circuit substrate and that have a second region for supporting the formation of a right-angle bend to accommodate mounting in an electronic device housing are shown in FIG. 1.

As shown in FIG. 1, flexible printed circuit structures 10 may have a substrate such as substrate 26. Substrate 26 may be formed from a sheet of polyimide or other flexible polymer. Conductive structures such as metal trace 18 may be formed on the upper surface of substrate 26 and conductive structures such as metal trace 20 may be formed on the opposing lower surface of substrate 26. Flexible printed circuit structures 10 may, if desired, have three or more metal layers or only a single metal layer. The use of a two-metal layer configuration for structures 10 of FIG. 1 is merely illustrative.

Metal trace 18 may include portions 18-1, 18-2, and 18-3 (as examples). Flexible printed circuit structures 10 may include a first region such as region 12, a second region such as region 14, and a third region such as region 16. Region 12 may be used to form a transmission line. For example, a microstrip transmission line may be formed using a positive signal line formed from trace 18-1 and ground signal line formed from trace 20. Trace portions 18-2 and 18-3 may form an antenna resonating element for an antenna. Via structure 22 may couple ground signal trace 20 to trace portion 18-2. Terminals 28 and 30 may be coupled to radio-frequency transceiver circuitry.

To ensure satisfactory operation of the transmission line in region 12, it may be desirable to ensure that thickness T1 of substrate 26 in region 12 has a minimum value (e.g., about 50 microns). To ensure that portion 16 of structures 10 can be bent about bend axis 24 to fit structures 10 within an electronic device housing structure, it may be desirable to ensure that thickness T2 of portion 16 of substrate 26 (or at least the region of substrate 26 that overlaps bend axis 24) has a maximum value that is less than T1 (e.g., 25 microns). In regions 12 and 14, flexible printed circuit structures 10 may be planar or may be bent. In region 16, substrate 26 may be bent as shown in FIG. 1, so that substrate 26 exhibits a bend radius R about bend axis 24. The value of bend radius R may be, for example, less than 5 mm, less than 2 mm, less than 1 mm, or less than 0.4 mm (e.g., substrate 26 may bend more in region 16 than in regions 12 and 14). The value of thickness T1 in regions 12 and 14 may be selected to ensure that printed circuit structures 10 satisfy desired mechanical and/or electrical design criteria (e.g., transmission line loss criteria). The value of thickness T2 in region 16 may be selected to ensure that substrate 26 can bend about axis 24 with a desired maximum bend radius R and a desired bend angle. Other types of flexible printed circuit structures may use substrates with different regions having different electrical and mechanical properties if desired. The example of FIG. 1 is merely illustrative.

Figure 2:
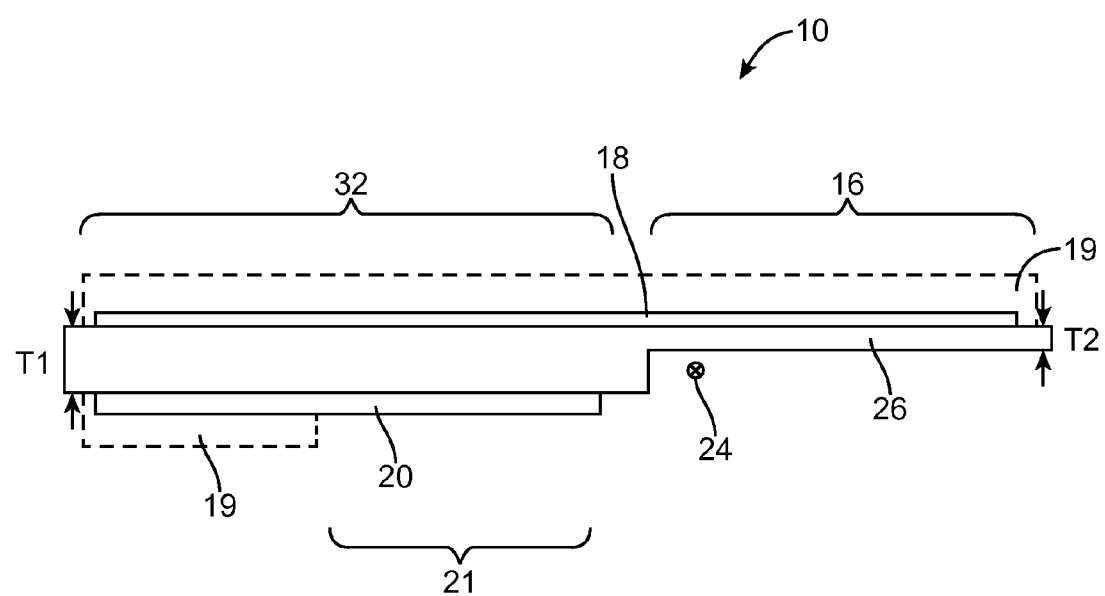
FIG. 2 is a side view of illustrative flexible printed circuit structures having a polymer substrate with different thicknesses in different regions in accordance with an embodiment of the present invention.

FIG. 2 is a cross-sectional side view of illustrative flexible printed circuit structures 10 having substrate 26 of thickness T1 in region 32 (e.g., region 12 and/or 14 of FIG. 1) and having substrate 26 of thickness T2 in region 16. If desired, some or all of metal traces 18 and 20 may be covered by adhesive layers and/or insulating layers such as coverlay layer 19. However, this is merely illustrative. If desired, flexible printed circuit structures 10 may be provided without any coverlay layer or a portion such as portion 21 of metal trace 20 (or metal trace 18) may be exposed (e.g., may remain uncovered by coverlay layer 19) in order to provide a conductive contact on flexible printed circuit structures 10.

Figure 3:
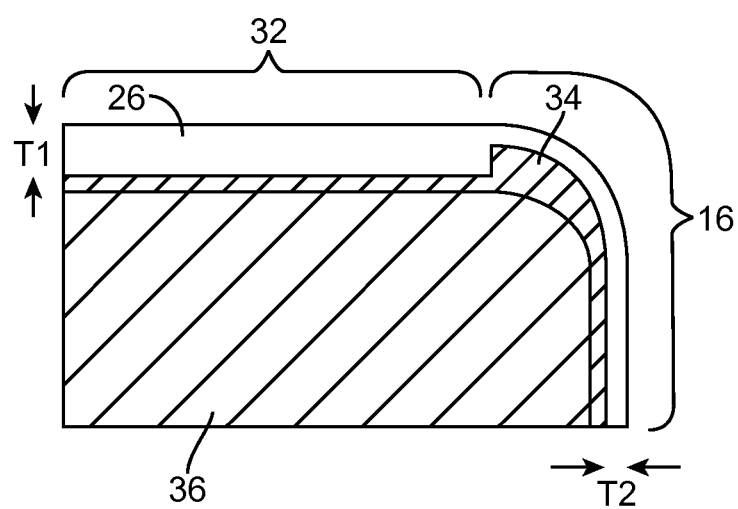
FIG. 3 is a side view of illustrative flexible printed circuit structures mounted on a support structure in accordance with an embodiment of the present invention.

FIG. 3 is a cross-sectional side view of flexible printed circuit structures 10 in a configuration in which adhesive layer 34 has been used to attach flexible printed circuit structures 10 to a support structure such as dielectric support structure 36 (e.g., a plastic support, a portion of a housing member, a printed circuit substrate, or other support structure). The structures of FIG. 3 may be mounted within an electronic device housing (e.g., a housing formed from metal housing walls, plastic housing walls, glass or ceramic structures, etc.). Adhesive layer 34 may be formed from a liquid adhesive, a film adhesive such as a pressure sensitive adhesive, a light-cured adhesive or other suitable adhesive. If desired, other engagement members (e.g., snaps, clips, screws, or other structures) may be used in combination with adhesive layer 34 or in place of adhesive layer 34 for attaching flexible printed circuit structures 10 to a support structure such as dielectric support structure 36.

Figure 4:
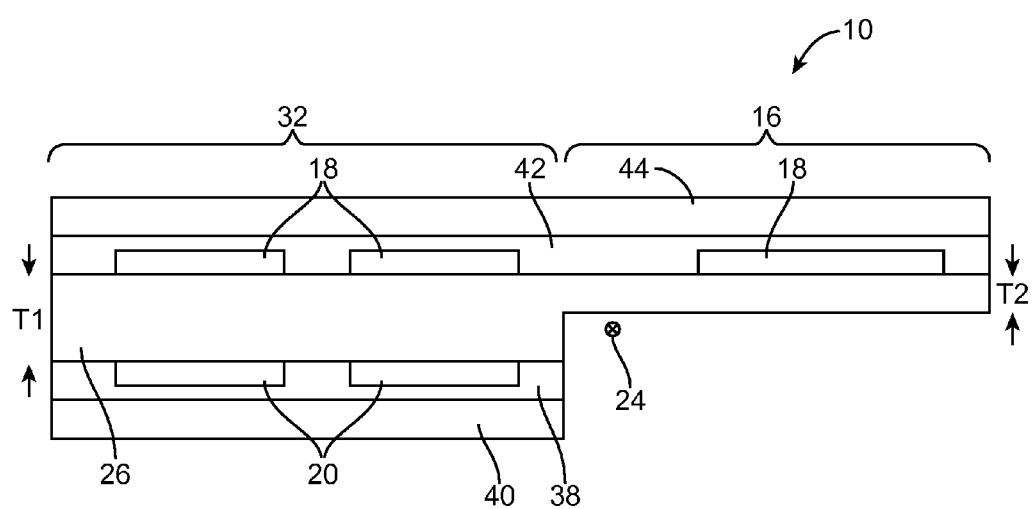
FIG. 4 is a side view of illustrative flexible printed circuit structures with regions of different thicknesses in accordance with an embodiment of the present invention.

As shown in FIG. 4, patterned metal trace 18 on the upper surface of polyimide substrate 26 may be covered with a layer of adhesive such as layer 42 and a layer of patterned coverlay (i.e., a solder mask formed from patterned polyimide or other suitable material) such as layer 44. Patterned metal trace 20 on the lower surface of substrate 26 may be covered with a layer of adhesive such as layer 38 and a layer of patterned coverlay such as layer 40. To promote bending of substrate 26 about bend axis 24 in region 16, substrate 26 in region 16 may be maintained free of adhesive 38 and coverlay 40, as shown in FIG. 4. Coverlay 44 and adhesive 42 may also be excluded from region 16 to promote flexibility, if desired. Some or all of metal traces 18 and 20 may also be excluded from certain portions of structures 10 to promote bending. In the FIG. 4 configuration, for example, metal layer 20 has been excluded from region 16. Part of the thickness of a given metal layer may also be removed to promote flexibility, if desired.

Figure 5:
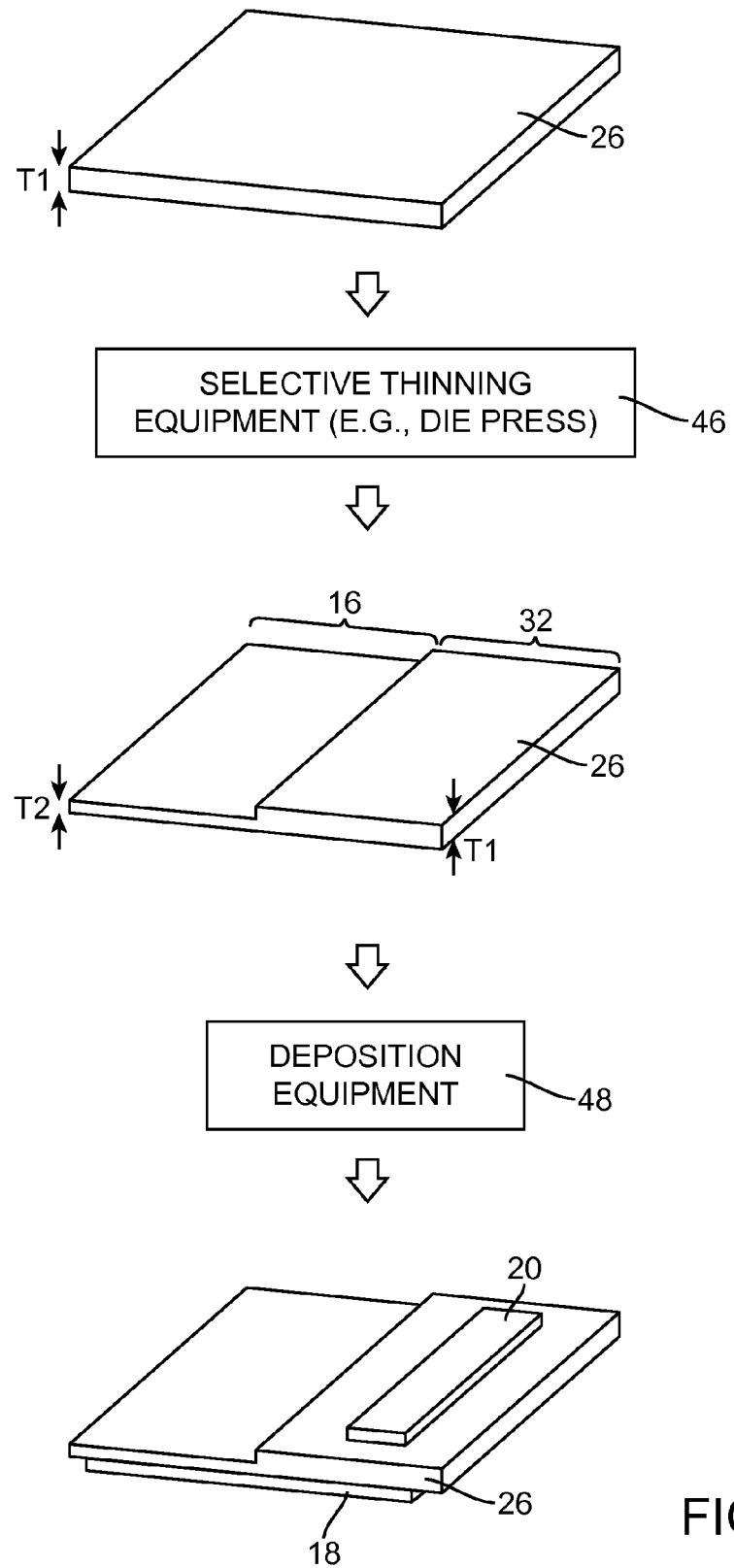
FIG. 5 is a diagram showing how flexible printed circuit structures may be processed to selectively thin a portion of a substrate in accordance with an embodiment of the present invention.

FIG. 5 is a diagram showing how a flexible printed circuit substrate such as substrate 26 may be provided with multiple thicknesses.

Initially, substrate 26 may be formed from a sheet of polyimide or other flexible polymer having a single uniform thickness such as thickness T1.

Using selective thinning tool 46, region 16 of substrate 26 may be thinned until exhibiting a thickness T2 that is less than T1. Thinning equipment 46 may include a die that presses down more in region 16 than in region 32, may be etching equipment, may be machining equipment, may be light-based equipment such as laser-based equipment, or may be any other equipment for selectively removing part of substrate layer 26. The example of FIG. 5 shows how two distinct regions (regions 16 and 32) may be formed each having a different respective thickness. If desired, multi-thickness substrates may be formed that have three or more different thicknesses.

Following formation of multi-thickness substrate 26, substrate 26 may be coated with patterned metal layers such as layers 18 and 20 using metal deposition and patterning equipment 48. Equipment 48 may include physical vapor deposition equipment, screen printing equipment, spraying equipment for spraying conductive inks, pad printing equipment, foil lamination equipment, electrochemical deposition equipment, photolithographic equipment, or other equipment for forming patterned metal traces on the surfaces of substrate 26.

Figure 6:
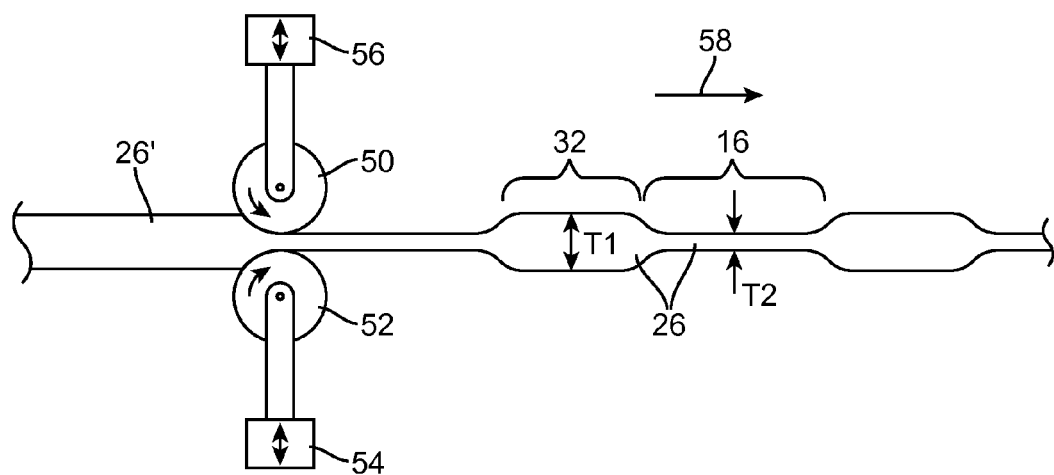
FIG. 6 is a diagram showing how roller-based fabrication equipment may be used to generate a flexible printed circuit substrate having multiple thicknesses in accordance with an embodiment of the present invention.

If desired, roller-based equipment such as the equipment of FIG. 6 may be used in forming multi-thickness substrate 26. With this type of arrangement, a flexible polymer substrate such as substrate 26' (e.g., a layer of polyimide) may be fed into rollers 52 and 50. As layer 26' moves between rollers 52 and 50 in direction 58, computer-controlled positioners 54 and 56 may be used to control the vertical separation between the opposing surfaces of rollers 50 and 52. By alternating the spacing between rollers 50 and 52 so that the spacing is sometimes equal to distance T1 and is sometimes equal to distance T2 as the substrate moves in direction 58, substrate 26 may be produced having corresponding thicknesses T1 (in regions such as region 32) and T2 (in regions such as region 16). Substrate 26 may be die cut, laser cut, or cut using other cutting equipment to produce individual flexible printed circuit structures.

Figure 7:
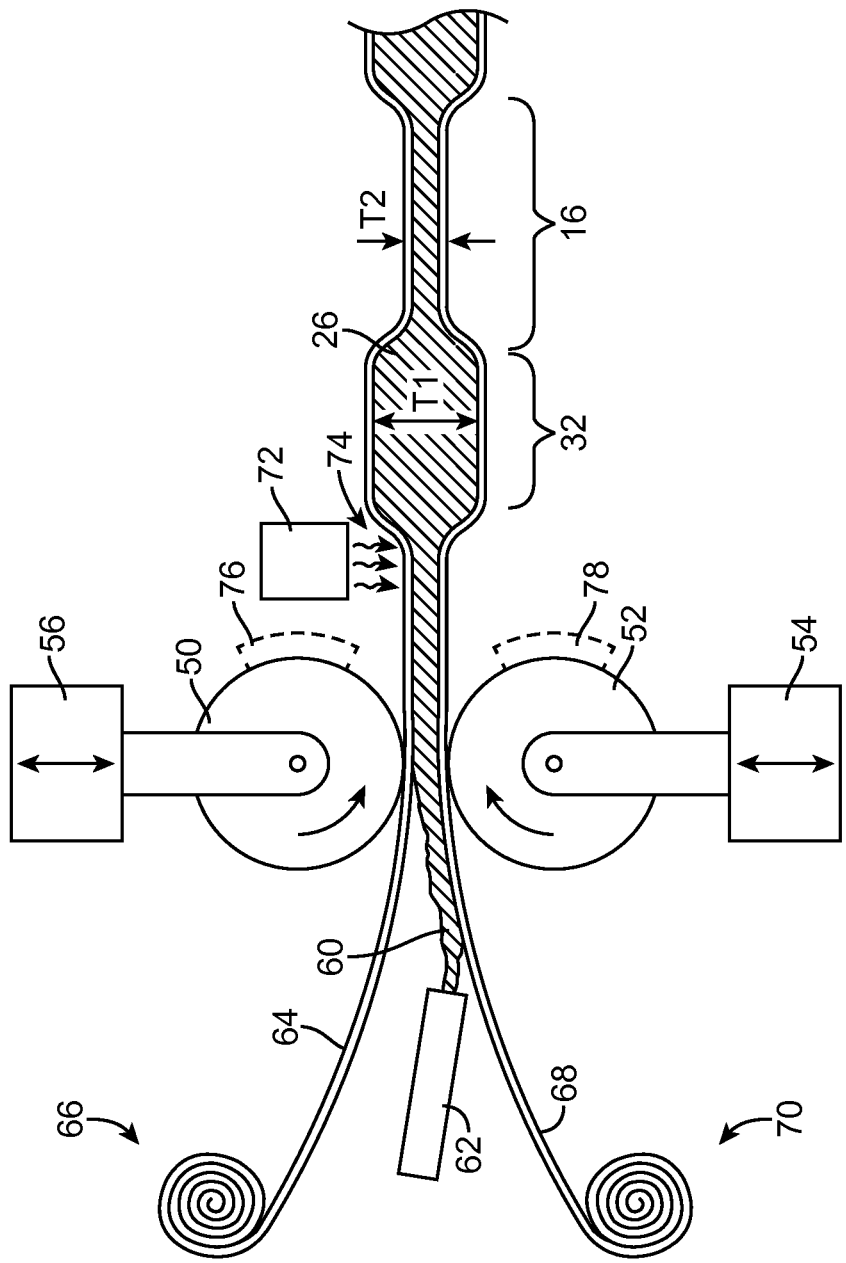
FIG. 7 is a diagram showing how roller-based fabrication equipment may be used to roll multiple sheets of dielectric material and a liquid material together to form a flexible printed circuit substrate having multiple thicknesses in accordance with an embodiment of the present invention.

In the illustrative configuration of FIG. 7, liquid dielectric material 60 is being dispensed between polymer sheet 64 and polymer sheet 68. Polymer sheet 64 may be dispensed from a roll of polymer material such as roll 66. Polymer sheet 68 may be dispensed from a roll of polymer material such as roll 70. Polymer sheets 64 and 68 may be, for example, polyimide layers. Liquid material 60 may be dispensed by dispensing equipment 62 (e.g., a liquid dispensing nozzle, spraying equipment, etc.). Material 60 may be, for example, liquid (uncured) polyimide or adhesive. After passing through rollers 50 and 52, heat (i.e., infrared light 74) may be applied by heat source 72 to cure material 60. Heat source 72 may be an infrared lamp or other source of heat. If desired, rollers 50 may be heated to cure material 60.

During the process of rolling layers 64 and 68 with liquid material 60, computer-controlled positioners such as positioners 54 and 56 may be used to control the relative position between rollers 52 and 50, thereby producing substrate 26 with thicker regions such as region 32 with thickness T1 and thinner regions such as region 16 with thickness T2. If desired, substrate thickness variations such as these may be produced by providing rollers 50 and 52 with raised portions. For example, roller 50 of FIG. 7 may be provided with raised portions such as raised portion 76 and roller 52 of FIG. 7 may be provided with raised portion 78. When the substrate is compressed between elevated portions 76 and 78, thinner regions 16 may be formed. If desired, rollers 50 and 52 of FIG. 6 may be provided with raised portions such as portions 76 and 78 to form thicker and thinner substrate regions.

Figure 8:
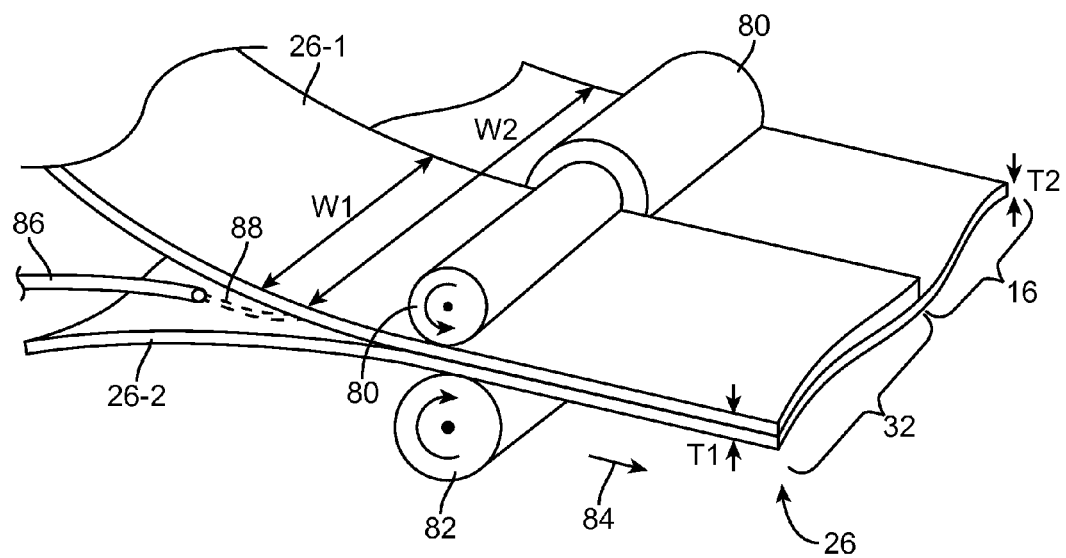
FIG. 8 is a perspective view of roller-based fabrication equipment being used to roll together flexible substrate layers to produce a flexible substrate with multiple thicknesses in accordance with an embodiment of the present invention.

FIG. 8 shows how multi-thickness substrate 26 may be formed by attaching (laminating) a first polymer layer such as polyimide layer 26-1 to a second polymer layer such as polyimide layer 26-2. A dispenser such as dispenser 86 may be used to spray or otherwise dispense an optional liquid material such as material 88 between polyimide layer 26-1 and polyimide layer 26-2. Material 88 may be liquid adhesive, liquid polyimide, or other liquid material for attaching layer 26-1 to layer 26-2 (e.g., a liquid polymer).

With an arrangement of the type shown in FIG. 8, layer 26-1 may have a first width W1 and layer 26-2 may have a second width W2 that is greater than W1, thereby creating multi-thickness substrate 26 of thickness T1 (in region 32) and thickness T2 (in region 16) at the exit of rollers 80 and 82, as substrate 26 moves in direction 84. As shown in FIG. 8, rollers 80 may, if desired, be provided with portions having a radius that is smaller than the radius of other portions of rollers 80. For example, a roller such as roller 80 may have portion with a radius suitable for accommodating the additional thickness of layer 26-1 during laminating operations.

Figure 9:
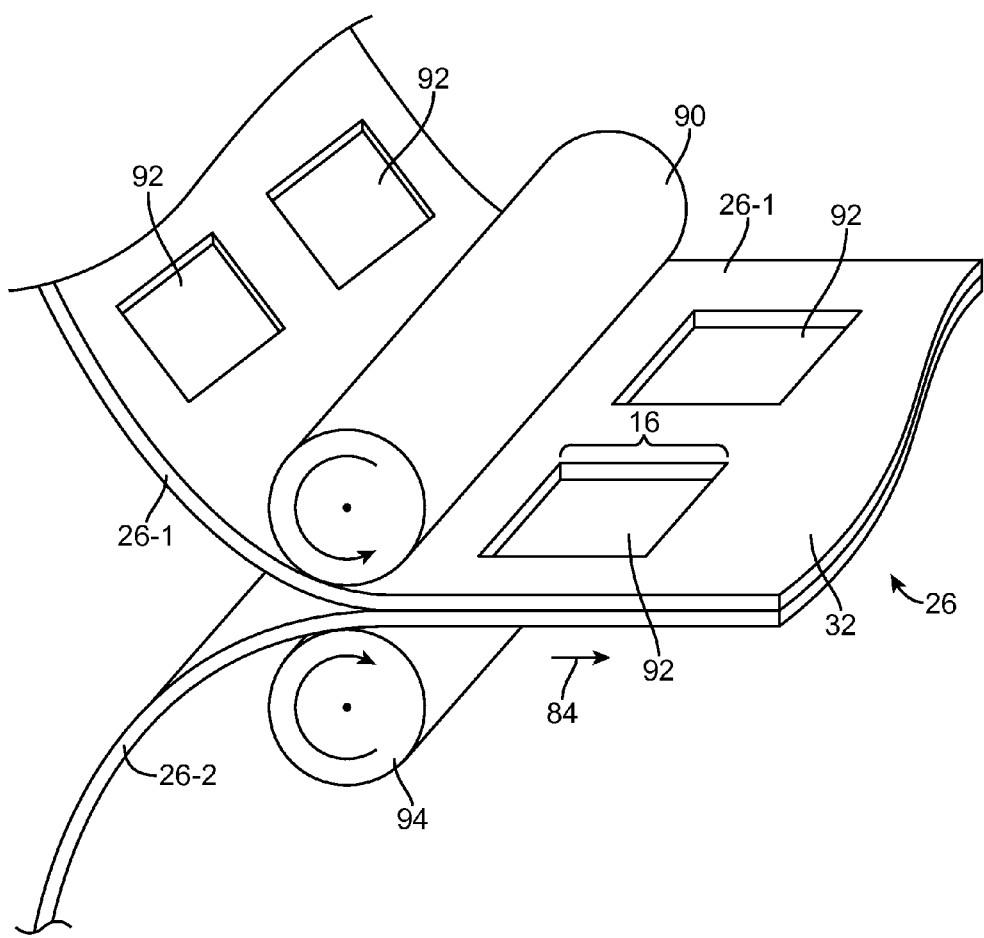
FIG. 9 is a perspective view of roller-based fabrication equipment being used to roll together flexible substrate layers including a patterned layer with holes and a solid layer to produce a flexible substrate with multiple thicknesses in accordance with an embodiment of the present invention.

As shown in FIG. 9, upper polymer layer 26-1 (e.g., a first polyimide layer) may be patterned (e.g., by incorporating openings such as openings 92 into layer 26-1). Lower polymer layer 26-2 (e.g., a second polyimide layer) may be a solid layer of polyimide. When pressed together by rollers 90 and 94 (with or without using optional liquid adhesive, liquid polyimide, or other material such as material 88 of FIG. 8 between layers 26-1 and 26-2), layers 26-1 and 26-2 may form multi-thickness substrate 26. As shown in FIG. 9, substrate 26 may have thicker regions such as regions 32 of thickness T1 and thinner regions such as regions 16 (associated with holes 92 in layer 26-1) of thickness T2.

Figure 10:
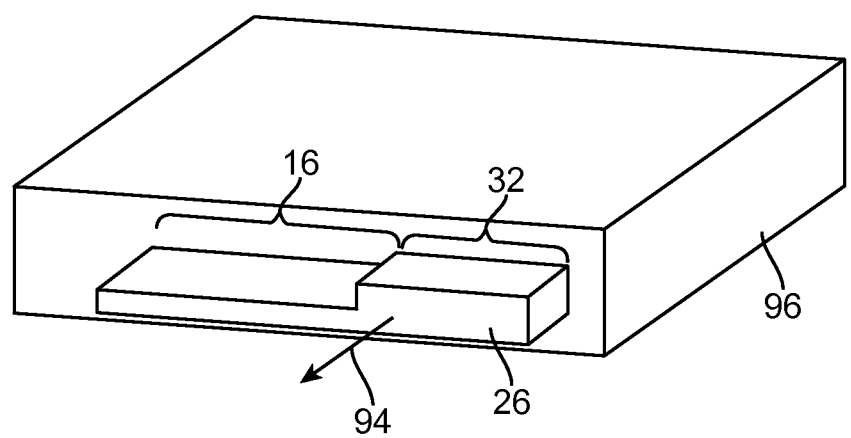
FIG. 10 is a perspective view of an extrusion tool of the type that may be used to produce a flexible substrate having multiple thicknesses or other features such as grooves in accordance with an embodiment of the present invention.

If desired, multi-thickness substrate 26 may be extruded using an extrusion tool. As shown in FIG. 10, for example, substrate 26 may be extruded in direction 94 from extrusion head 96 of an extrusion tool. The extrusion tool openings may be configured so that substrate 26 has a first thickness such as thickness T1 in thicker region 32 and a second thickness such as thickness 16 in thinner region 32.

Figure 11:
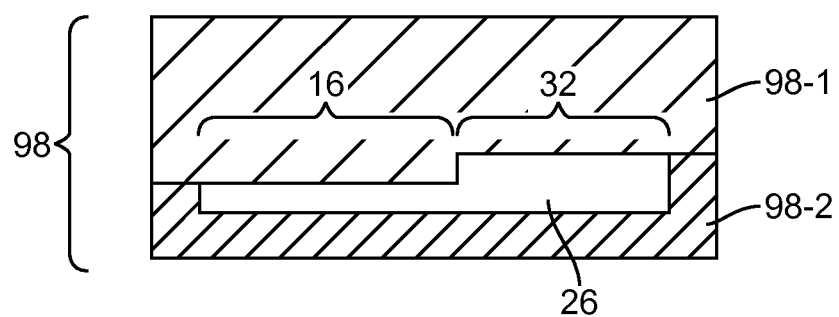
FIG. 11 is a cross-sectional side view of a tool such as a mold or die being used to form a flexible substrate having multiple thicknesses in accordance with an embodiment of the present invention.

FIG. 11 shows how a die or mold may be used to form multi-thickness substrate 26. Tool 98 may have a first portion such as upper portion 98-1 and a second portion (or more portions) such as lower portion 98-2. The material for substrate 26 (which may be cured or uncured material in the form of a sheet of polymer, polymer pellets, liquid polymer, or other material), may be compressed between upper portion 98-1 and lower portion 98-2. During compression, heat may optionally be applied to the material of substrate 26 to cure the material (e.g., when tool 98 is a mold for molding and curing polymer substrate 26) or to soften the material (e.g., when tool 98 is a die that is compressing a uniform sheet of polymer to produce a multi-thickness substrate such as substrate 26).

Figure 12:
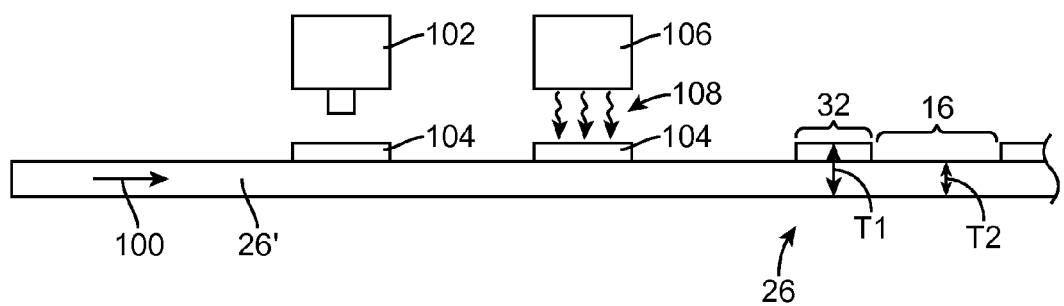
FIG. 12 is a side view of illustrative equipment being used to selectively thicken a flexible substrate by depositing and curing liquid polymeric material in accordance with an embodiment of the present invention.

With the illustrative arrangement of FIG. 12, substrate 26 may be formed by moving uniform substrate layer 26' past material dispensing equipment 102 in direction 100. Equipment 102 may apply material 104 to the upper surface of substrate layer 26'. Material 104 may be polyimide or other polymer material. Following curing with infrared light 108 from infrared lamp 106 or other heat source, material 104 may cure to form polyimide (or other suitable polymer). Following curing, substrate 26 may be characterized by portions with thickness T1 such as region 32 and portions with thickness T2 such as region 16.

Figure 13:
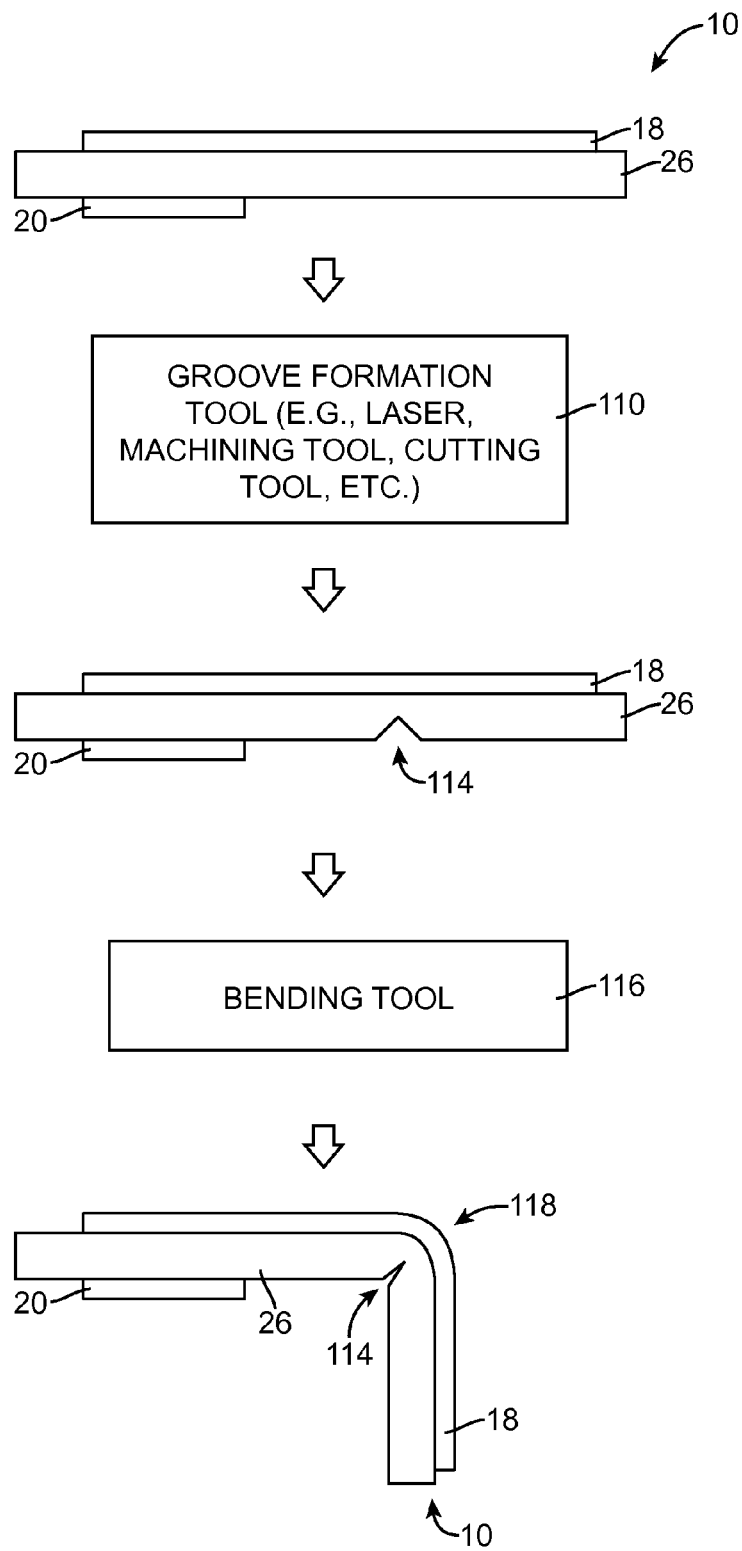
FIG. 13 is a diagram showing how a groove may be formed in a flexible substrate to promote bending of the flexible substrate in accordance with an embodiment of the present invention.

FIG. 13 is a diagram showing how bending of substrate layer 26 may be promoted by localized thinning of layer 26. As shown in FIG. 13, flexible printed circuit structures 10 may include metal traces such as traces 18 and 20 on a polymer layer such as polyimide substrate layer 26. Layer 26 in the example of FIG. 13 may initially have a uniform thickness T.

Using material removal equipment 110, some of the material of layer 26 may be locally removed. For example, material may be removed from layer 26 to form groove 114. Groove formation tool 110 may be a laser, a machining tool, a knife blade, scribing tool, or other cutting tool or scoring equipment. As shown in FIG. 13, following formation of groove 114 in substrate layer 26, bending tool 116 (e.g., a computer-controlled arm or other equipment) may be used to bend substrate 26 to form bend 118 along groove 114. Bend 118 may also be formed manually, if desired. The presence of groove 114 locally decreases the thickness of substrate layer 26, thereby facilitating bending.

Figure 14:
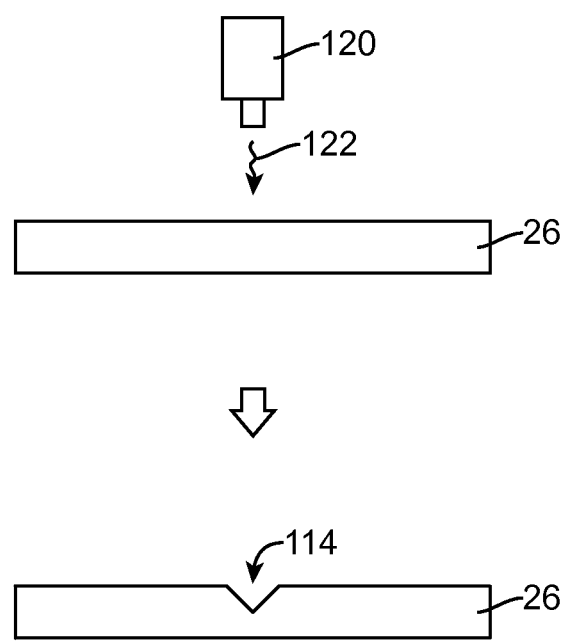
FIG. 14 is a side view of illustrative light-based equipment such as a laser-based tool that may be used to remove material from a substrate to form a groove to promote bending of the flexible substrate in accordance with an embodiment of the present invention.

FIG. 14 shows how light-based equipment such as laser 120 may be used to apply a beam of laser light such as light 122 to substrate 26. Laser light 122 may be, for example, an ultraviolet, visible, or infrared laser beam. Computer-controlled equipment may be used to scan beam 122 across the surface of substrate 26 to form groove 114.

Figure 15:
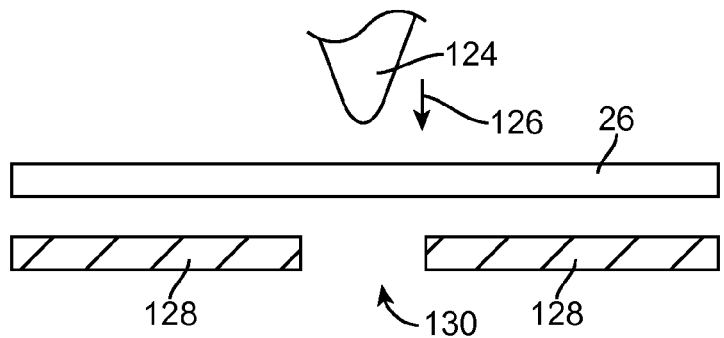
FIG. 15 is a cross-sectional side view of a tool having an opening into which a flexible substrate may be pressed to form a groove in the flexible substrate to promote bending of the flexible substrate in accordance with an embodiment of the present invention.

If desired, groove 14 may be formed by removing a portion of the material that makes up substrate layer 26 using a machining tool, knife edge, or other cutting equipment. Initially, substrate 26 may be placed in equipment such as the equipment of FIG. 15. Biasing member 124 may be moved in direction 126 to push a portion (e.g., a groove-shaped portion) of substrate 26 through opening 130 in tool 128. Opening 130 may be an elongated slot in tool 128 that has a longitudinal axis extending into the page in the orientation of FIG. 15. Tool 128 may be a metal plate (as an example).

Figure 16:
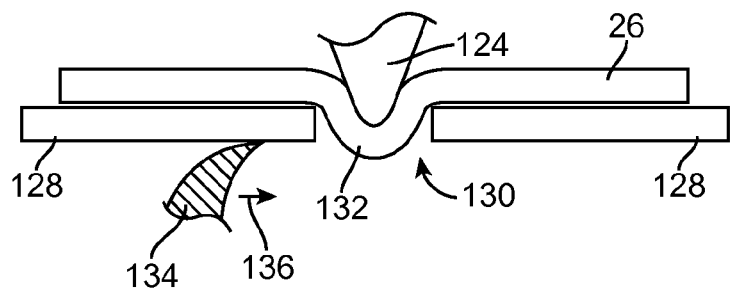
FIG. 16 is a cross-sectional side view of the tool of FIG. 15 following the pressing of the flexible substrate into the opening in accordance with an embodiment of the present invention.
Figure 17:
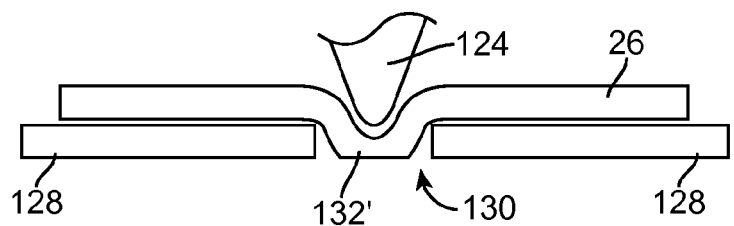
FIG. 17 is a cross-sectional side view of the tool of FIG. 16 following removal of protruding material from the flexible substrate to form a groove in the flexible substrate in accordance with an embodiment of the present invention.
Figure 18:
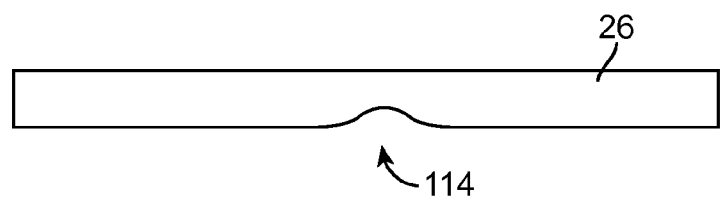
FIG. 18 is a cross-sectional side view of a flexible substrate that has been provided with a groove to facilitate bending using equipment of the type shown in FIGS. 15, 16, and 17 in accordance with an embodiment of the present invention.

Using biasing member 124 in this way, portion 132 of substrate 26 may be caused to protrude through opening 130 in plate 128. By moving cutting tool 134 (e.g., a knife edge, milling head, or other cutting equipment) in direction 136 (or other suitable directions) as shown in FIG. 16, portion 132 may be removed from substrate 26 to form cut surface 132' on substrate 26 (FIG. 17).

Following removal of biasing tool 124, substrate 26 may exhibit a recess such as groove 114 to facilitate subsequent bending of substrate 26.

Figure 19:
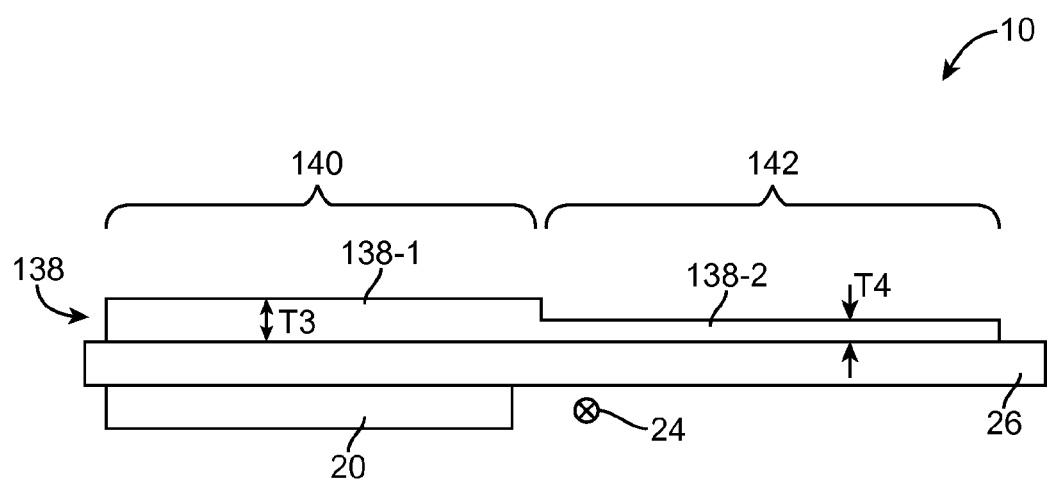
FIG. 19 is a cross-sectional side view of flexible printed circuit structures having a metal layer or other layer with a locally thinned region to promote bending in accordance with an embodiment of the present invention.

If desired, layers of material on substrate 26 such as layers of adhesive, layers of metal, layers of coverlay, and other material layers may be selectively thinned in certain regions and/or may be selectively omitted in certain regions to promote bending of layer 26 about bend axis. As shown in FIG. 19, for example, flexible printed circuit structures 10 may have layers on polyimide substrate 26 such as lower layer 20 and upper layer 138. Layer 20 may be, for example, a metal trace. Upper and/or lower layers of material such as layer 138 may also include an adhesive layer, a layer of coverlay, or a combination of two or more or three or more of these layers and other optional layers. For example, layer 138 may be a metal trace layer such as layer 18. In region 140, portion 138-1 of layer 138 may have a first thickness (T3). In region 142, portion 138-2 of layer 138 may have a second thickness (T4), where T4 is less than T3. Fabrication tools such as selective thinning equipment 46, material removal equipment such as equipment 110, or selective deposition equipment (see, e.g., dispensing tool 102 of FIG. 12) may be used in thinning layer 138 in region 142 to form layer 138-2.

Figure 20:
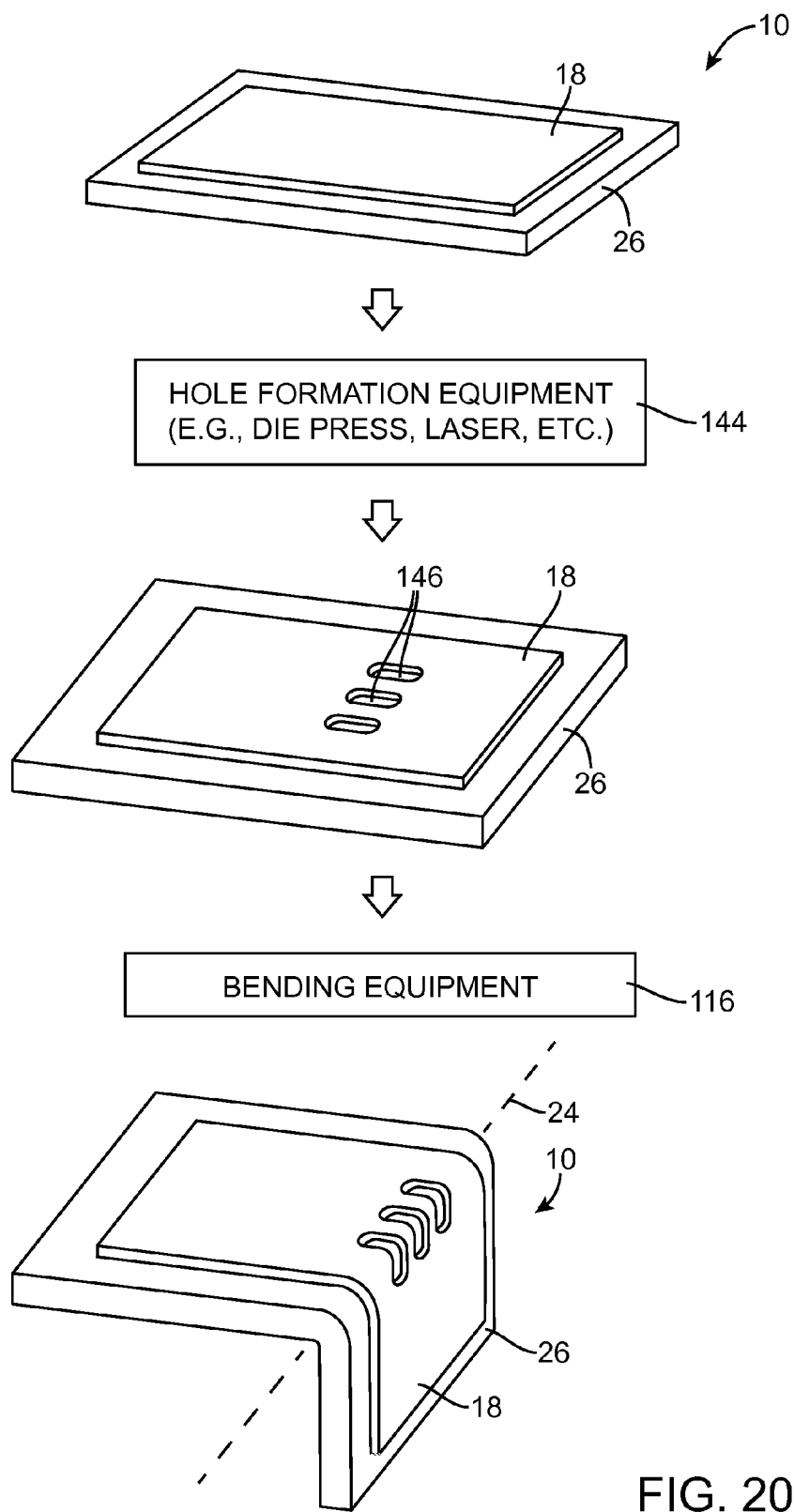
FIG. 20 is a diagrams showing how holes may be formed in a substrate to promote bending in accordance with an embodiment of the present invention.

FIG. 20 is a diagram showing how openings may be formed in flexible printed circuit structures 10 along bend axis 24 to facilitate bending flexible printed circuit structures 10. As shown in FIG. 20, structures 10 may initially be formed from polyimide substrate 26 and metal traces such as metal traces 18 (and if desired, traces 20).

Hole formation equipment 144 such as a laser, die press, or other cutting equipment may be used in forming openings 146 in structures 10. Openings 146 may, if desired, be formed at a relatively small size. For example, in a situation in which trace 18 is being used to form an antenna, openings 146 may be formed that have lateral dimensions that are less than a tenth of a wavelength at a desired frequency of operation for the antenna to avoid adversely affecting antenna operation. As shown in FIG. 20, openings 146 may include openings that pass through traces 18 and polymer substrate layer 26.

If desired, openings 146 may be elongated, slotted, or otherwise shaped, sized, and positioned to avoid adversely affecting electrical functioning of traces 20 while facilitating bending around bend axis 24. All openings 146 may have a common size and shape or some openings 146 may have a size and/or shape that is different from the size and/or shape respectively of other openings 146. Openings 146 may be evenly spaced or may be arranged in other configurations.

After forming one or more openings such as openings 146 (e.g., openings aligned along bend axis 24), structures 10 may be bent along bend axis 24, as shown in FIG. 20. Because material was removed from openings 146 prior to bending, less material will be available in structures 10 along axis 24 than would otherwise be present, thereby facilitating bending.

Figure 21:
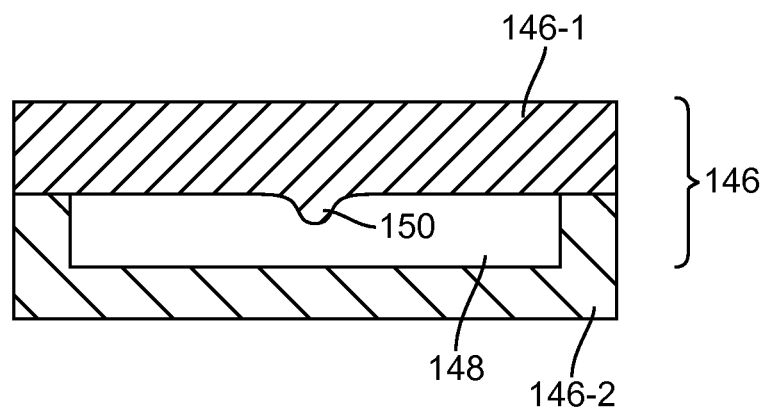
FIG. 21 is a cross-sectional side view of a die or mold of the type that may be used to create a groove in a flexible substrate to promote bending in accordance with an embodiment of the present invention.
Figure 22:
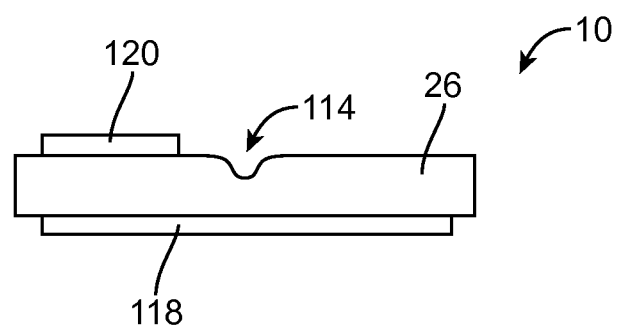
FIG. 22 is a cross-sectional side view of a flexible substrate following formation of a groove using equipment of the type shown in FIG. 21 and following the formation of patterned metal traces in accordance with an embodiment of the present invention.

FIG. 21 shows how a tool such as a die or mold may be used to form a groove in substrate 26. Initially, as shown in FIG. 21, the material for forming substrate 26 (e.g., cured polyimide sheet, polymer precursor material, or other material) may be compressed within the inner cavity of tool 146. Tool 146 may be a die or a mold. Tool 146 may have two or more pieces such as upper member 146-1 and lower member 146-2. During operation, members 146-1 and 146-2 may be pressed towards each other. Material 148 may be compressed and deformed by a die or molded into shape by members 146-1 and 146-2 (e.g., when tool 146 is a mold). Due to the presence of protrusion 150 (e.g., a rib that extends into the page in the orientation of FIG. 21), groove 114 of FIG. 22 may be formed in substrate 26 by tool 146 to facilitate bending.

Figure 23:
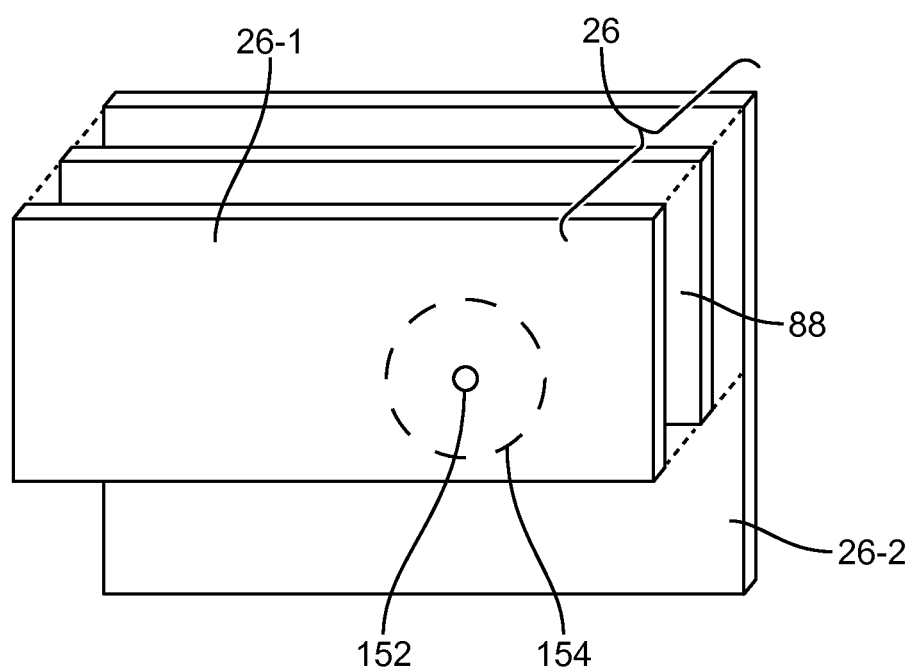
FIG. 23 is an exploded perspective view of illustrative flexible printed circuit structures in which flexible polymer layers of different sizes are being attached using adhesive to form a substrate with multiple thicknesses in accordance with an embodiment of the present invention.

As shown in the exploded perspective view of substrate 26 of FIG. 23, it may be desirable to use a layer of adhesive such as adhesive 88 when assembling substrate 26 from multiple layers such as polyimide layer 26-1 and polyimide layer 26-2. To prevent adhesive 88 from touching the sidewalls of via 152, adhesive 88 may be omitted from within adhesive keep-out area 154 during lamination.

Figure 24:
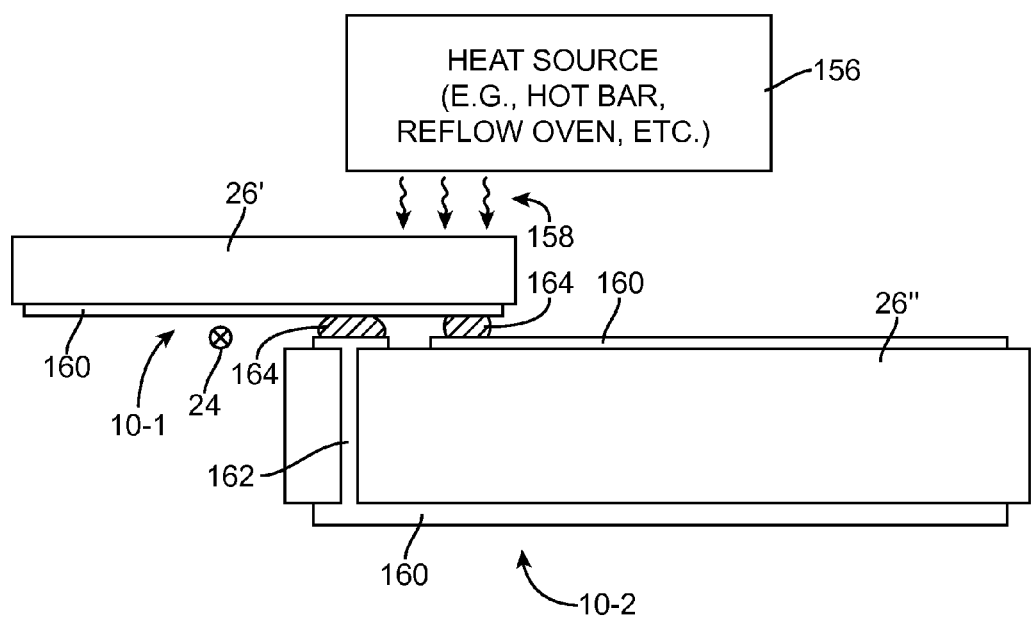
FIG. 24 is a diagram showing how flexible printed circuit substrates may be joined to form a flexible printed circuit structure with multiple substrate thicknesses in accordance with an embodiment of the present invention.

If desired, flexible printed circuit structures 10 with multiple thicknesses may be formed by electrically and mechanically attaching a thicker piece of flexible printed circuit material to a thinner piece of flexible printed circuit material. Consider, as an example, the arrangement of FIG. 24. As shown in FIG. 24, flexible printed circuit structures 10 may be formed from first portion 10-1 with substrate portion 26' and second portion 10-2 with substrate portion 26". Substrate portion 26' may have a smaller thickness (e.g., thickness T2) and substrate portion 26" may have a larger thickness (e.g., thickness T1, where T1 is greater than T2). Patterned metal traces such as traces 160 and vias such as via 162 may be formed on substrates 26' and 26" before assembly of portions 10-1 and 10-2 to form structures 10.

Patterned metal traces such as traces 160 and exposed portions of vias such as via 162 may be provided with a surface plating such as gold plating using a plating process such as Hot Air Solder Leveling (HASL), Organic Solder Protective (OSP) coating, Electroless Nickel Immersion Gold (ENIG) or any other plating process before assembly of portions 10-1 and 10-2 to form structures 10.

If desired, conductive surfaces on portion 10-1 may be plated using a plating process that is different from the plating processes used to plate conductive surfaces on portion 10-2.

As an example, portion 10-1 may have conductive surfaces that are plated with nickel and gold using an ENIG process while portion 10-2 may have conductive surfaces plated with solder or other materials using an OSP coating process. Providing portions 10-1 and 10-2 with coatings formed using different plating processes may help reduce production costs, increase reliability, or otherwise facilitate production of flexible printed circuit structures 10.

During assembly of structures 10-1 and 10-2, a heat source such as heat source 156 (e.g., an infrared lamp, a laser, a hot bar, a reflow oven, or other heat source) may be used to emit infrared radiation (heat 158) that reflows solder 164, thereby mechanically and electrically the metal traces on substrate 26" with the metal traces on substrate 26'. If desired, other conductive materials (e.g., conductive adhesive) may be used in joining structures 10-1 and 10-2. Because the thickness of layer 26' is thinner than the thickness of layer 26", bending of layer 26' about bend axis 24 may be facilitated.

Figure 25:
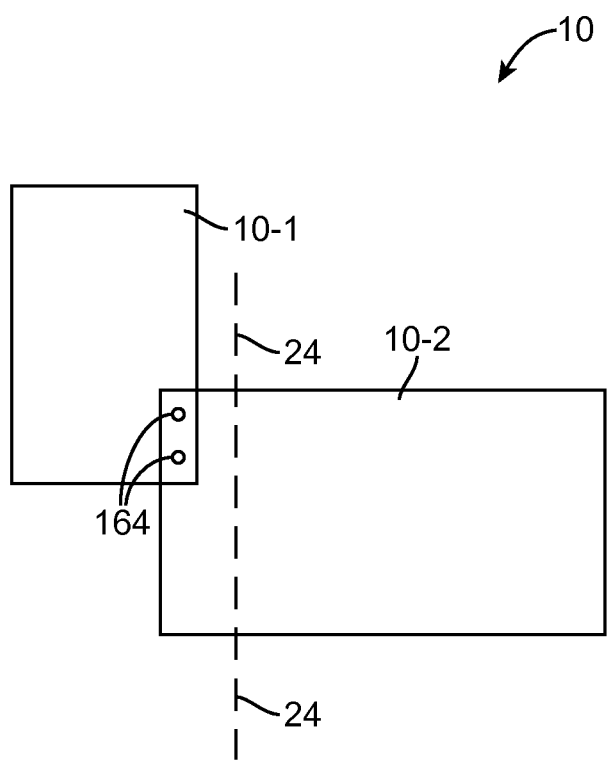
FIG. 25 is a top view of flexible printed circuit substrates of different thicknesses that have been joined using connections along edge portions of the substrates in accordance with an embodiment of the present invention.

FIG. 25 is a top view of flexible printed circuit structures 10 that have been formed from first and second portions 10-1 and 10-2 with different respective polyimide substrate thicknesses. Conductive material 164 may, in general, be solder, conductive adhesive, or other conductive material for coupling portions 10-1 and 10-2.

Figure 26:
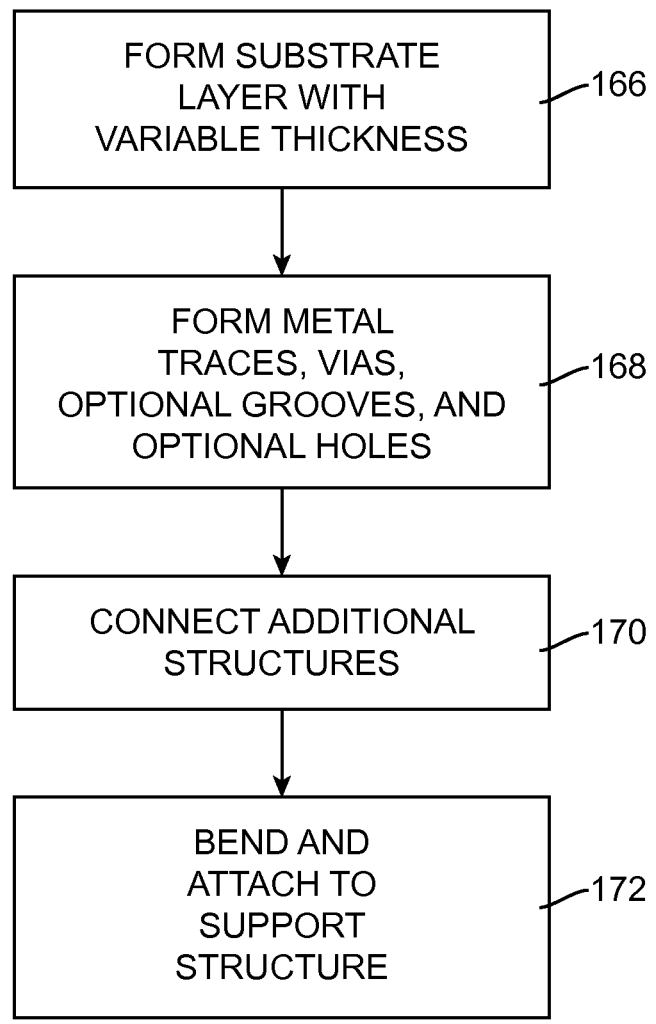
FIG. 26 is a flow chart of illustrative steps involved in forming flexible printed circuit structures with different regions that have different mechanical and electrical properties such as portions for forming bends and portions for forming electrical structures in accordance with an embodiment of the present invention.

A flow chart of illustrative steps involved in forming flexible printed circuit structures 10 is shown in FIG. 26.

At step 166, substrate layer 26 may, if desired, be formed with multiple thicknesses. For example, a layer of polymer such as a sheet of polyimide may be provided with a first portion that has a thickness T1 and a second portion that has a thickness T2 that is less than T2. The substrate may also have additional portions with additional thicknesses, if desired.

Following formation of the polymer substrate, metal traces such as traces 18 and 20 may be formed on the substrate (step 168). During the operations of step 168, optional features such as through-substrate vias, grooves to facilitate bending, and holes to facilitate bending may be incorporated into the substrate.

Additional structures such as additional portions of polyimide substrate with different thicknesses may, if desired, be incorporated during the operations of step 170 (e.g., by forming solder connections between layers, by forming connections using conductive adhesive, or otherwise forming conductive paths that attach the additional layer or layers of polyimide substrate material to the substrate).

During the operations of step 172, the flexible printed circuit structures that have been formed may be bent and, if desired, attached to a support structure.

Figure 27:
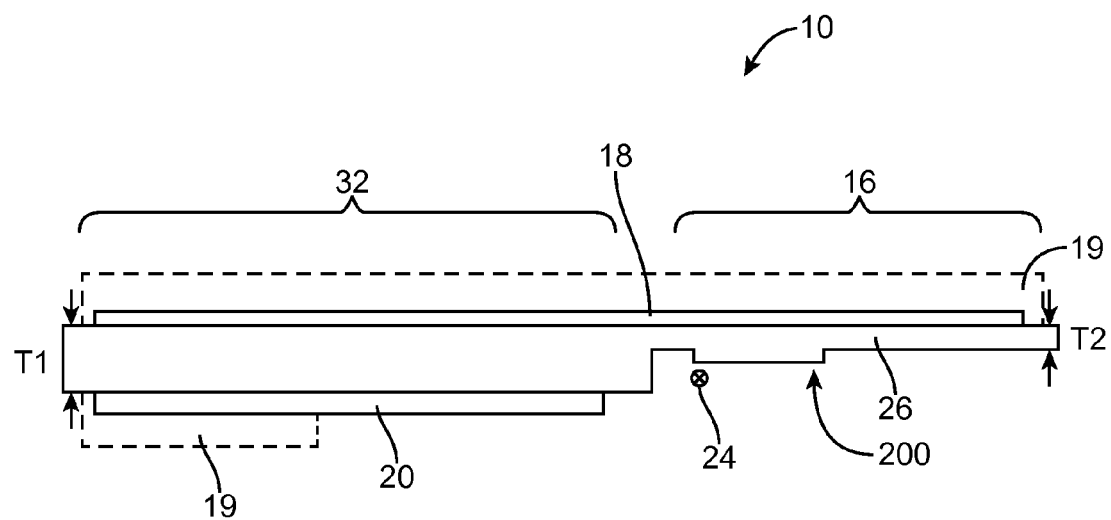
FIG. 27 is a side view of illustrative flexible printed circuit structures having a polymer substrate with different thicknesses in different regions including a stiffening region in accordance with an embodiment of the present invention.

FIG. 27 is a side view of flexible printed circuit substrate 10 showing how, if desired, a stiffening structure such as stiffening structure 200 may be included on substrate 26 in order to provide a desired amount of resistance to bending. Stiffening structure 200 may be a portion of region 16 of substrate 26 that is relatively wider than other portions of region 16 (e.g., a region having an additional layer of polyimide) or may include a stiffener that is attached to, or embedded in, substrate 26.

Region 16 of substrate 26 may be bent into any suitable shape during assembly and manufacturing operations. Stiffening structure 200 may be configured to provide region 16 with a restoring force that resists further bending of region 16 after assembly and manufacturing operations have been completed (e.g., for providing additional strength to region 16 or for using region 16 as a substitute for a torsion spring).

Figure 28:
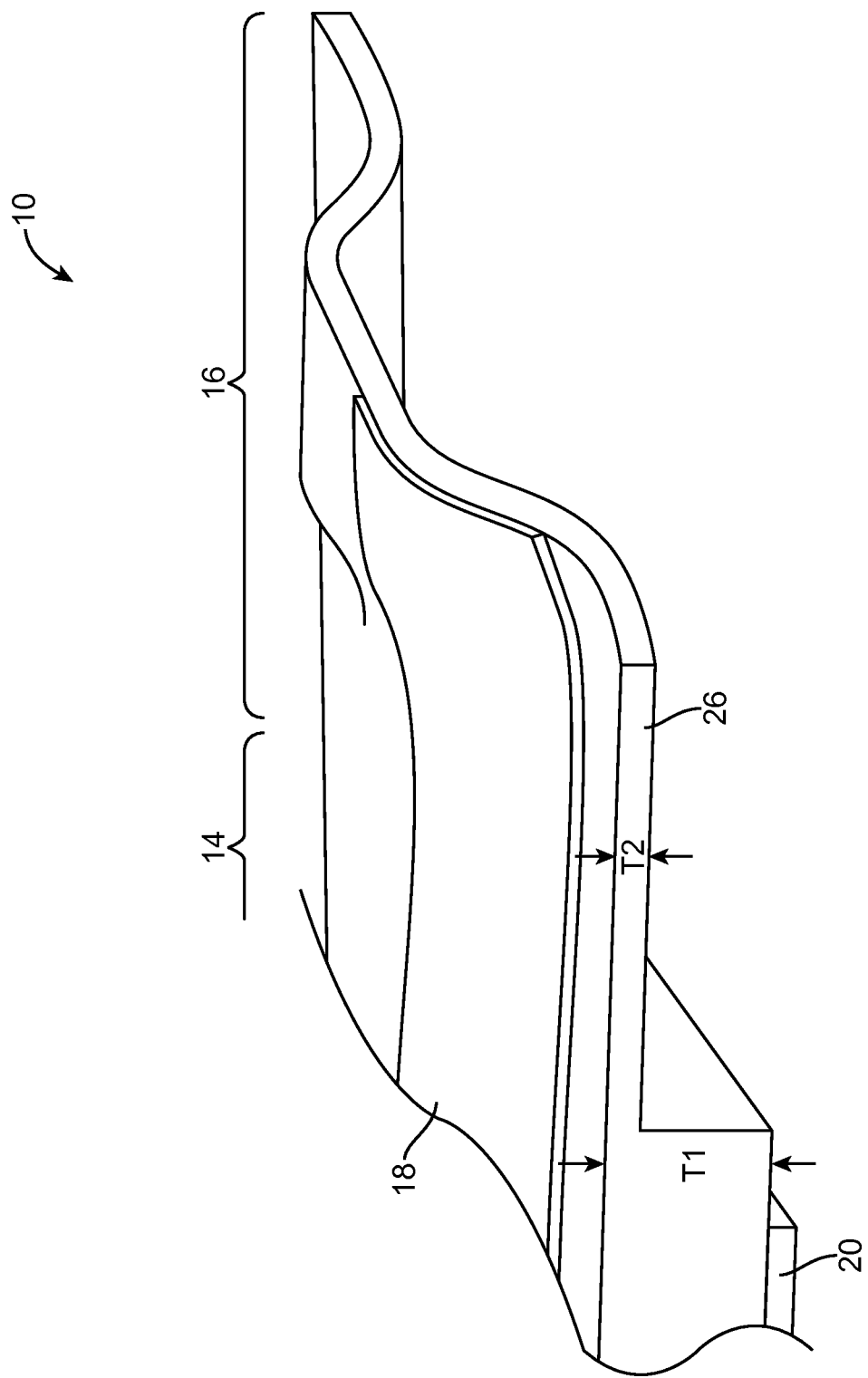
FIG. 28 is a perspective view of illustrative flexible printed circuit structures showing how bends in the flexible printed circuit structures may include bends and warps that conform to a 2-dimensional or 3-dimensional splined surface in accordance with an embodiment of the present invention.

FIG. 28 is a perspective view of flexible printed circuit substrate 10 showing how region 16 of substrate 26 may be bent into more complex shapes than a pure radial bend about a single bend radius such as bends and warps that conform to a 2-dimensional or 3-dimensional splined surface. As shown in FIG. 28, in region 16, substrate 26 may be bent so that substrate 26 exhibits a complex bend in multiple dimensions.

A complex bend such as that shown in FIG. 28 may be used to conform portion 16 of substrate 26 to a surface such as a surface of a device housing or an internal support structure that is curved in one or more dimensions.

The foregoing is merely illustrative of the principles of this invention and various modifications can be made by those skilled in the art without departing from the scope and spirit of the invention.

What is claimed is:

1. Flexible printed circuit structures, comprising:
 a polymer sheet having a first region with a first thickness and a second region with a second thickness that is thinner than the first thickness; and
 patterned metal traces on the polymer sheet, wherein the polymer sheet is bent within the second region, and wherein the polymer sheet is bent along an axis and wherein the polymer sheet comprises a groove along the axis.

2. The flexible printed circuit structures defined in claim 1 wherein the patterned metal traces are configured to form a radio-frequency transmission line in the first region.

3. The flexible printed circuit structures defined in claim 2 wherein the patterned metal traces are configured to form antenna structures in the second region.

4. The flexible printed circuit structures defined in claim 3, wherein the transmission line comprises first and second metal traces on opposing sides of the polymer sheet in the first region.

5. The flexible printed circuit structures defined in claim 3, wherein the antenna structures are electrically connected to the second metal trace through a via in the polymer sheet.

6. The flexible printed circuit structures defined in claim 3 wherein the polymer sheet is bent at a right angle.

7. The flexible printed circuit structures defined in claim 3, wherein the polymer sheet comprises at least two layers of polyimide joined by an adhesive.

8. Flexible printed circuit structures, comprising:
 a polymer sheet;
 metal traces on the polymer sheet, wherein the metal traces have a first thickness in a first region of the polymer sheet and have a second thickness that is thinner than the first thickness in a second region of the polymer sheet and wherein the polymer sheet is bent in the second region;
 a layer of adhesive on the metal traces, wherein the layer of adhesive is present in the first region and is absent from the second region; and
 a solder mask layer on the adhesive in the first region, wherein the solder mask is absent from the second region.

9. The flexible printed circuit structures defined in claim 8 wherein the metal traces are configured to form a radio-frequency transmission line in the first region.

10. The flexible printed circuit structured defined in claim 8, wherein the metal traces are configured to form a microstrip radio-frequency transmission line in the first region.

11. Flexible printed circuit structures, comprising:
 a polymer sheet; and
 metal traces on the polymer sheet, wherein the metal traces have a first thickness in a first region of the polymer sheet and have a second thickness that is thinner than the first thickness in a second region of the polymer sheet, wherein the polymer sheet is bent in the second region, wherein the metal traces are configured to form a radio-frequency transmission line in the first region, and wherein the radio-frequency transmission line comprises first and second metal traces separated by the polymer sheet.

12. A method for forming a flexible printed circuit structures, comprising:
 forming a polymer sheet having a first region of a first thickness and a second region of a second thickness, wherein the second thickness is thinner than the first thickness;
 depositing metal traces that form an antenna resonating element in the second region and a radio-frequency transmission line in the first region; and
 bending the polymer sheet along an axis in the second region, wherein forming the polymer sheet having the first region of the first thickness and the second region of the second thickness comprises:
  providing a polymer sheet of the first thickness; and selectively thinning the polymer sheet to the second thickness in the second region.

13. A method for forming a flexible printed circuit structures, comprising:
   forming a polymer sheet having a first region of a first thickness and a second region of a second thickness, wherein the second thickness is thinner than the first thickness;
   depositing metal traces that form an antenna resonating element in the second region and a radio-frequency transmission line in the first region; and
   bending the polymer sheet along an axis in the second region, wherein forming the polymer sheet having the first region of the first thickness and the second region of the second thickness comprises:
     providing first and second polymer layers;
     dispensing liquid dielectric material between the first and second polymer layers; and
     rolling the liquid dielectric material between the first and second polymer layers to form the polymer sheet.

14. A method for forming a flexible printed circuit structures, comprising:
   forming a polymer sheet having a first region of a first thickness and a second region of a second thickness, wherein the second thickness is thinner than the first thickness;
   depositing metal traces that form an antenna resonating element in the second region and a radio-frequency transmission line in the first region; and
   bending the polymer sheet along an axis in the second region, wherein bending the polymer sheet along an axis in the second region comprises:
     forming a plurality of holes in the polymer sheet along the axis; and
     bending the polymer sheet along the axis.

* * * * *